US009786937B2

(12) United States Patent
Choi et al.

(10) Patent No.: US 9,786,937 B2
(45) Date of Patent: Oct. 10, 2017

(54) POWER CONVERTER FOR FUEL CELL AND METHOD FOR CONTROLLING THE SAME

(71) Applicant: Foundation of Soongsil University-Industry Cooperation, Seoul (KR)

(72) Inventors: Woojin Choi, Seoul (KR); Tuan Nguyen Thanh, Seoul (KR)

(73) Assignee: Foundation of Soongsil University-Industry Cooperation, Seoul (KR)

( * ) Notice: Subject to any disclaimer, the term of this patent is extended or adjusted under 35 U.S.C. 154(b) by 240 days.

(21) Appl. No.: 14/767,573

(22) PCT Filed: Aug. 14, 2014

(86) PCT No.: PCT/KR2014/007600
§ 371 (c)(1),
(2) Date: Aug. 12, 2015

(87) PCT Pub. No.: WO2015/072653
PCT Pub. Date: May 21, 2015

(65) Prior Publication Data
US 2016/0006061 A1    Jan. 7, 2016

(30) Foreign Application Priority Data

Nov. 14, 2013  (KR) .................. 10-2013-0138059
Jan. 21, 2014  (KR) .................. 10-2014-0006993

(51) Int. Cl.
*G05F 3/24*     (2006.01)
*H01M 8/04*    (2016.01)
(Continued)

(52) U.S. Cl.
CPC .......... *H01M 8/04865* (2013.01); *G05F 3/24* (2013.01); *H01M 8/0494* (2013.01);
(Continued)

(58) Field of Classification Search
None
See application file for complete search history.

(56) References Cited

U.S. PATENT DOCUMENTS

2015/0130277 A1* 5/2015 Ballantine ............... H02J 1/102
307/26
2015/0165925 A1* 6/2015 Lienkamp ................. B60L 7/14
307/10.1

FOREIGN PATENT DOCUMENTS

CN        101123310 A      2/2008
JP        2003-530667 A   10/2003
(Continued)

OTHER PUBLICATIONS

Ju Hyeong Lee, "Development of the Lifetime Estimation Method for the PEM Fuel Cells by the Electrochemical Impedance Spectroscopy", Soongsil University Master's Thesis, Jun. 2009, pp. 21-41 (Eng. Abstract at pp. 15-16).
(Continued)

*Primary Examiner* — Jared Fureman
*Assistant Examiner* — Aqeel Bukhari
(74) *Attorney, Agent, or Firm* — Novick, Kim & Lee, PLLC; Sang Ho Lee

(57) ABSTRACT

A power converter for a fuel cell is provided. The power converter includes a boost converter connected to the fuel cell and configured to control a load voltage at a predetermined magnitude in a normal operation mode and to induce an output response by applying a predetermined perturbation current to the fuel cell in a diagnosis mode, and a digital signal processor configured to extract an impedance parameter by detecting the output response of the fuel cell in the diagnosis mode, and predict a lifespan of the fuel cell according to the impedance parameter. The normal operation mode is configured to supply a voltage in response to a (Continued)

change of a load and the diagnosis mode is configured to predict the lifespan of the fuel cell.

9 Claims, 3 Drawing Sheets

(51) Int. Cl.
- *H02J 7/00* (2006.01)
- *H01M 8/04858* (2016.01)
- *H01M 8/04828* (2016.01)
- *H01M 8/04537* (2016.01)
- *G01R 31/36* (2006.01)

(52) U.S. Cl.
CPC ....... *H01M 8/04649* (2013.01); *H02J 7/0068* (2013.01); *H02J 7/0072* (2013.01); *G01R 31/3662* (2013.01); *G01R 31/3679* (2013.01)

(56) References Cited

FOREIGN PATENT DOCUMENTS

| | | |
|---|---|---|
| JP | 2003530667 A | 10/2003 |
| KR | 10-2004-0001776 A | 1/2004 |
| KR | 10-2008-0053864 A | 6/2008 |
| KR | 10-2011-0133118 A | 12/2011 |
| KR | 10-2013-0084343 A | 7/2013 |
| WO | 2012156401 A1 | 11/2012 |

OTHER PUBLICATIONS

Anna G. Stefanopoulou et al., "Mechatronics in fuel cell systems", Control Engineering Practice, Pergamon Press, vol. 15, No. 3, Jan. 31, 2006, pp. 277-289.

Dae-Kyu Choi et al., "A novel power conversion circuit for cost-effective battery-fuel cell hybrid systems", Journal of Power Sources, Elsevier SA, vol. 152, Apr. 12, 2005, pp. 245-255.

* cited by examiner

POWER CONVERTER FOR FUEL CELL AND METHOD FOR CONTROLLING THE SAME

BACKGROUND

The following description relates to a power converter for a fuel cell which can perform a diagnosis and a load leveling of the fuel cell, and a method of controlling the same.

Fuel cell technology is new environment-friendly future energy technology generating electric energy from a material which abundantly exists in the Earth such as oxygen and hydrogen, and is one among technologies in which the attention has been focused recently. The fuel cell directly converts chemical energy the oxygen and the hydrogen have into the electric energy by an electrochemical reaction, and obtains the electric energy of high efficiency without causing pollution since the oxygen is provided to a cathode and the hydrogen is provided to an anode, and the electrochemical reaction is proceeded in the form of an inverse reaction of a water electrolysis. Since the fuel cell is free from a limitation of a Carnot cycle acting as a limitation in a conventional heat engine, the fuel cell can have efficiency which is equal to or more than 40%, and since the material emitted as described above is only water, there is no concern of the pollution, and since a part moving mechanically is not needed unlike the conventional heat engine, there are various advantages in which there is no noise, etc. Accordingly, various kinds of technologies and studies related to the fuel cell are actively being carried out. However, in order to implement the fuel cell as an actual power supply system, it is necessary to compensate various problems of the fuel cell. First, since an overload withstand of the fuel cell is small, the fuel cell is largely used as a hybrid system connecting another energy storage device. The hybrid system is needed in order to manage by dividing an abrupt load change or a load exceeding a rated capacity of the fuel cell, and is a system using an auxiliary energy storage device for a high output for a short time besides the fuel cell, a battery or a super capacitor, etc. being used as the auxiliary energy storage device, and there is a cost reducing effect since the auxiliary energy storage device has a smaller cost about by $1/100$ than the fuel cell. Further, after configuring the hybrid system by connecting the fuel cell and the auxiliary energy storage device, constant power is continuously output from the fuel cell, when the power is left, the energy storage device is charged using the surplus power, and when the power is insufficient, a load leveling method in which the energy storage device subsidiarily outputs the insufficient power is applied. Further, since the fuel cell has a problem in which reliability of the system configured together depends on a state of the fuel cell, an evaluation through a periodic test of the fuel cell is needed. In order to evaluate a lifespan of the fuel cell, an offline method in which the fuel cell is separated from the system or an independent measurement device is attached to the outside, etc. can be applied, but the method is inefficient and inconvenient.

The present invention is directed to providing a power converter for a fuel cell which can perform a load leveling of the fuel cell and diagnose a lifespan of the fuel cell, and a method of controlling the same.

SUMMARY OF THE DISCLOSURE

One aspect of the present invention provides a power converter for a fuel cell which operates according to at least one of a normal operation mode of supplying a voltage needed according a change of a load and a diagnosis mode of predicting a lifespan of the fuel cell, the power converter for the fuel cell, including: a boost converter connected to the fuel cell, and configured to control a load voltage so as to have a predetermined magnitude in the normal operation mode and induce an output response by applying a predetermined perturbation current to the fuel cell in the diagnosis mode; and a digital signal processor configured to extract an impedance parameter by detecting the output response of the fuel cell in the diagnosis mode, and predict the lifespan of the fuel cell according to the impedance parameter.

The power converter for the fuel cell may further include: an auxiliary energy storage device connected between the boost converter and the load, and configured to charge power output from the fuel cell or discharge so as to supply to the load by increasing the power output from the fuel cell.

The power converter for the fuel cell may further include: a bidirectional converter connected to the auxiliary energy storage device, and configured to be switched so as to handle an abrupt change or a transient overload of the load.

The bidirectional converter may control an output voltage of the load in order to generate a perturbation current signal for the diagnosis by the boost converter in the diagnosis mode.

The boost converter may induce the perturbation current having a constant direct current (DC) level in the diagnosis mode, and the bidirectional converter may be switched and control the load voltage by charging or discharging the auxiliary energy storage device.

The digital signal processor may include: a voltage detector configured to measure the output response of the fuel cell; a digital lock-in amplifier configured to calculate an impedance spectrum of a voltage detected by the voltage detector; a parameter extractor configured to calculate a parameter according to the impedance spectrum extracted by the digital lock-in amplifier; a parameter analyzer configured to compare and analyze the parameter calculated by the parameter extractor and a reference parameter; and a lifespan predictor configured to predict the lifespan of the fuel cell according to the comparison result of the impedance parameter compared and analyzed by the parameter analyzer and a reference parameter which is previously stored.

Another aspect of the present invention provides a method of controlling a power converter for a fuel cell including a load, a fuel cell configured to supply power to the load, a boost converter connected to the fuel cell and configured to be switched, an auxiliary energy storage device connected between the boost converter and the load and configured to charge or discharge, a bidirectional converter configured to switch so that the auxiliary energy storage device is charged or discharged, and a digital signal processor configured to perform a signal processing by detecting an output of the fuel cell, the method, including: operating according to at least one of a normal operation mode of supplying a voltage needed according a change of a load and a diagnosis mode of predicting a lifespan of the fuel cell; and controlling a voltage of the load by charging or discharging the auxiliary energy storage device by switching the boost converter so as to apply a perturbation current having a constant magnitude to the fuel cell when operating in the diagnosis mode, and by switching the bidirectional converter so as to maintain a voltage output from the fuel cell at a constant DC level.

When operating in the normal operation mode, the boost converter may control the voltage output from the fuel cell so as to have a predetermined magnitude, and the bidirectional converter may charge or discharge the auxiliary energy storage device in order to implement a load leveling operation.

In the diagnosis mode, the digital signal processor may measure an output response of the fuel cell, calculate an impedance spectrum from the output response, calculate a parameter according to the impedance spectrum, and predict the lifespan by comparing the parameter and a reference parameter which is previously stored.

The digital signal processor may generate a warning signal when it is confirmed that the lifespan of the fuel cell is equal to or less than a reference value.

As described above, according to an aspect of the present invention, the lifespan of the fuel cell can be diagnosed in the circuit capable of implementing the load leveling.

MODES OF THE INVENTION

Figure 1:
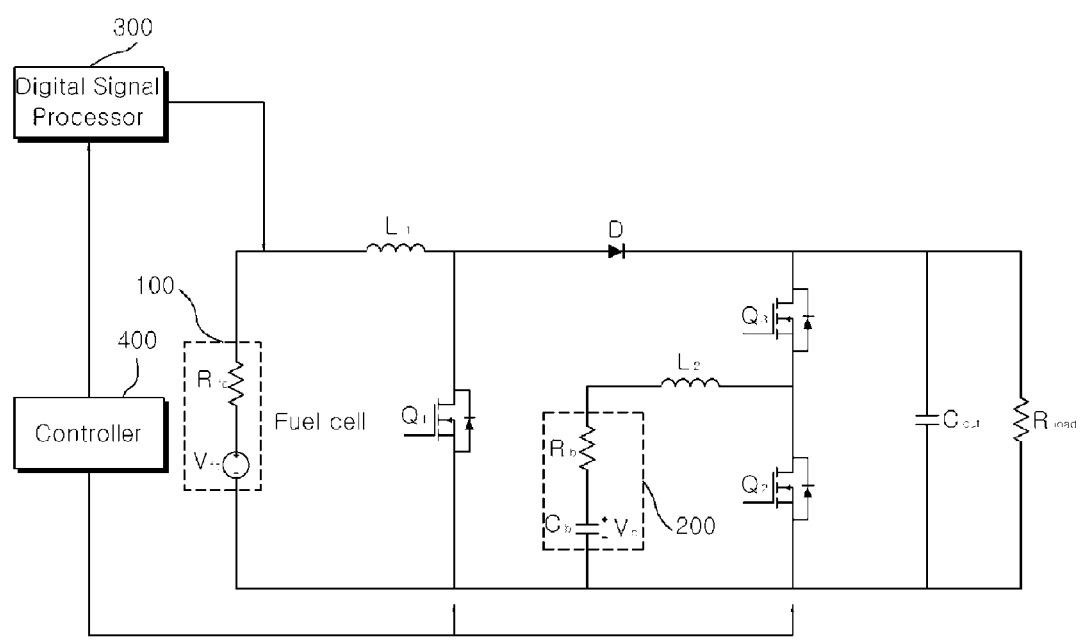
FIG. 1 is a circuit diagram illustrating a power converter for a fuel cell according to an exemplary embodiment of the present invention.

Hereinafter, a power converter for a fuel cell and a method of controlling the same according to embodiments of the present invention will be described below in more detail with reference to the accompanying drawings. When adding reference numerals in elements of each drawing, if possible, a like reference numeral will be used for a like element even though the like element is shown in another drawing.

FIG. 1 is a circuit diagram illustrating a power converter for a fuel cell according to an exemplary embodiment of the present invention.

A power converter for a fuel cell may include a fuel cell 100, a boost converter $L_1$, $Q_1$, a bidirectional converter $Q_2$, $Q_3$, $L_2$, an auxiliary energy storage device 200, an output capacitor $C_{out}$, a load $R_{load}$, a digital signal processor 300, and a controller 400.

The power converter for the fuel cell may perform an operation according to one of a normal operation mode of supplying a voltage needed according to a change of the load $R_{load}$, and a diagnosis mode of predicting a lifespan of the fuel cell 100.

The power converter for the fuel cell may control a voltage applied to the load $R_{load}$ in the normal operation mode, and perform a load leveling in response to an abrupt load change, etc.

The load leveling may compensate for load power using the power of the auxiliary energy storage device 200 when the power of the fuel cell 100 is smaller than the power which should be supplied to the load $R_{load}$, and adjust the power which is excessively supplied to the load $R_{load}$ by charging surplus power to the auxiliary energy storage device 200 when the power of the fuel cell 100 is greater than the power which should be supplied to the load $R_{load}$.

In the normal operation mode, the boost converter $L_1$, $Q_1$ of the power converter for the fuel cell may control a load voltage so as to have a predetermined magnitude, and the bidirectional converter $Q_2$, $Q_3$, $L_2$ may be used in order to handle the abrupt load change or a transient overload. The boost converter $L_1$, $Q_1$ may boost a voltage output from the fuel cell 100 and control so as to maintain a constant magnitude, and the bidirectional converter $Q_2$, $Q_3$, $L_2$ may control in order to charge the power of the fuel cell 100 to the auxiliary energy storage device 200 by turning on or off the second switch $Q_2$ and the third switch $Q_3$, or increase the load voltage by discharging the auxiliary energy storage device 200.

As described above, the boost converter L1, $Q_1$ of the power converter for the fuel cell may control the load voltage so as to have the predetermined magnitude, the bidirectional converter $Q_2$, $Q_3$, $L_2$ may add additional power to the power of the fuel cell 100 by charging the power of the fuel cell 100 to the auxiliary energy storage device 200 or discharging predetermined power from the auxiliary energy storage device 200 in order to handle the abrupt load change or the transient overload.

In the diagnosis mode, the power converter for the fuel cell may perform an integral diagnosis using an electrochemical impedance spectroscopy (EIS) method.

In the diagnosis mode, the boost converter $L_1$, $Q_1$ of the power converter for the fuel cell may perform an input current control in order to generate a perturbation current signal for performing the EIS method, and the bidirectional converter $Q_2$, $Q_3$, $L_2$ may control the load voltage.

During performing of the EIS method, operations of the boost converter $L_1$, $Q_1$ and the bidirectional converter $Q_2$, $Q_3$, $L_2$ may be separately performed. This may be a prerequisite condition for successively measuring an impedance in spite of the load change. In the diagnosis mode, the boost converter $L_1$, $Q_1$ may make a perturbation current, and the bidirectional converter $Q_2$, $Q_3$, $L_2$ may control the load voltage by charging or discharging the auxiliary energy storage device 200. Since the bidirectional converter $Q_2$, $Q_3$, $L_2$ is suitably controlled, a direct current (DC) level of the voltage output from the fuel cell 100 may not be changed according to the change of the load $R_{load}$.

When the fuel cell 100 is perturbed by a current having a sine wave form, a voltage response may be measured in response to the current perturbation. A digital lock-in amplifier (DLIA) may be included in the digital signal processor (DSP), and be used for calculating the same phase and different phase components of the current perturbation and the voltage response, and an alternating current (AC) impedance of the fuel cell 100 for each frequency.

An equivalent circuit parameter of the fuel cell 100 may be extracted from an impedance measured using a complex non-linear least square method. At this time, the extracted parameter may be used to predict the lifespan of the fuel cell. This may be implemented by comparing the extracted parameter and an initial parameter. A detailed description thereof will be described hereinafter.

The controller 400 may perform an overall control of the power converter for the fuel cell.

The controller 400 may switch the boost converter $L_1$, $Q_1$, and first, second, and third switches $Q_1$, $Q_2$, $Q_3$ included in the bidirectional converter $Q_2$, $Q_3$, $L_2$, and control an operation of the digital signal processor 300. The controller 400 may control a circuit to operate either one of the normal operation mode or the diagnosis mode described above. The controller 400 may control a switching operation at a suitable timing, and control various operations of boosting by charging the power in the inductor $L_1$ included in the boost converter $L_1$, $Q_1$, or the inductor $L_2$ included in the bidirectional converter $Q_2$, $Q_3$, $L_2$ or discharging the power, etc.

Figure 2:
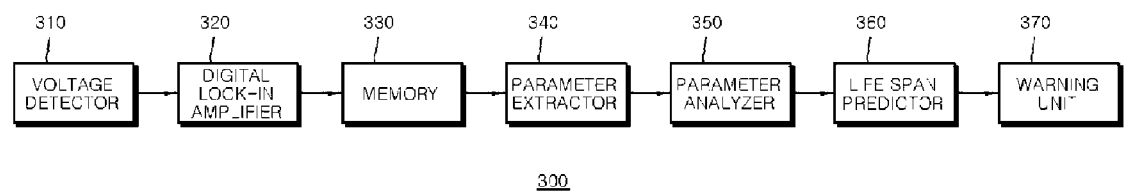
FIG. 2 is a control block diagram illustrating a digital signal processor included in a power converter for a fuel cell according to an exemplary embodiment of the present invention.

FIG. 2 is a control block diagram illustrating a digital signal processor included in a power converter for a fuel cell according to an exemplary embodiment of the present invention.

The digital signal processor 300 may include a voltage detector 310, a digital lock-in amplifier 320, a memory 330, a parameter extractor 340, a parameter analyzer 350, a lifespan predictor 360, and a warning unit 370.

The voltage detector 310 may detect a voltage of the fuel cell 100. The voltage detector 310 may detect a voltage for each frequency in which the boost converter $L_1$, $Q_1$ induces from the fuel cell 100 by a signal of the digital signal processor 300. Meanwhile, the voltage detector 310 may operate by being substituted by a current and voltage detector 310, and be used as a block which can measure the voltage response by the current perturbation or the current response by the voltage perturbation.

The digital lock-in amplifier 320 may calculate an impedance spectrum of the voltage for each frequency detected by the voltage detector 310. An AC signal received by the digital lock-in amplifier 320 is expressed by the following Equation 1.

$$X[n] = A\sin\left(2\pi \frac{f}{f_s}n + \theta\right) + \Sigma A_{ne}\sin\left(2\pi \frac{f_{ne}}{f_s}n + \theta_{ne}\right) \quad [\text{Equation 1}]$$

The following Equations 2 and 3 may be obtained by multiplying the detected signal X[n] by an in-phase signal $C_n$ and a quadrature-phase signal $S_n$.

$$I[n] = [X(n) \times \quad [\text{Equation 2}]$$
$$C_n] = \left[A\sin\left(2\pi\frac{f}{f_s}n+\theta\right) + \Sigma A_{ne}\sin\left(2\pi\frac{f_{ne}}{f_s}n+\theta_{ne}\right)\right] \times$$
$$\cos\left(2\pi\frac{f}{f_s}n\right) = \frac{A}{2}\cos(\theta) + \text{AC component}$$

$$Q[n] = [X(n) \times \quad [\text{Equation 3}]$$
$$S_n] = \left[A\sin\left(2\pi\frac{f}{f_s}n+\theta\right) + \Sigma A_{ne}\sin\left(2\pi\frac{f_{ne}}{f_s}n+\theta_{ne}\right)\right] \times$$
$$\sin\left(2\pi\frac{f}{f_s}n\right) = \frac{A}{2}\sin(\theta) + \text{AC component}$$

The digital lock-in amplifier 320 may obtain a magnitude and a phase as shown in the following Equations 4 and 5 by filtering the AC components of the Equations 2 and 3.

$$x = 2 \times I[n] \approx A\cos(\theta); \quad y = 2 \times Q[n] \approx A\sin(\theta) \quad [\text{Equation 4}]$$

$$M = \sqrt{x^2 + y^2} = A; \quad Ph = \tan^{-1}\left(\frac{y}{x}\right) = \theta \quad [\text{Equation 5}]$$

The memory 330 may store the impedance spectrum calculated by the digital lock-in amplifier 320.

Figure 3:
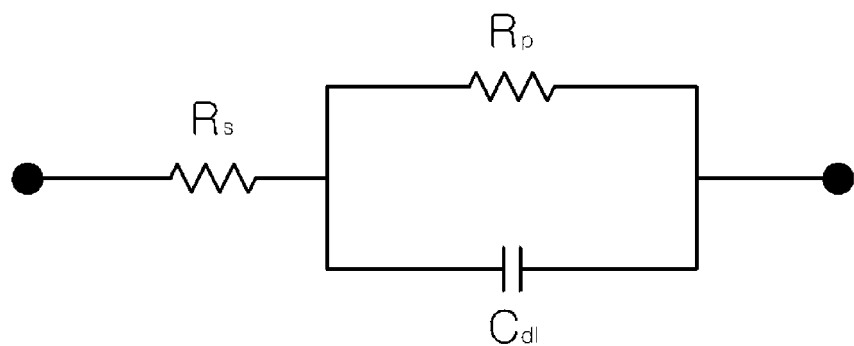
FIG. 3 is a diagram illustrating an example of an equivalent circuit used when calculating a lifespan of a fuel cell in a digital signal processor included in a power converter for a fuel cell according to an exemplary embodiment of the present invention.

The parameter extractor 340 may select an equivalent circuit model of the fuel cell 100 according to the impedance spectrum extracted by the digital lock-in amplifier 320. The equivalent circuit model may be modeled by a Randles equivalent circuit which is well known. Referring to FIG. 3, the equivalent circuit may be configured by two resistors $R_s$, $R_p$, and one capacitor $C_{dl}$.

The parameter extractor 340 may calculate an impedance of the equivalent circuit of the fuel cell 100 by the following Equation 6.

$$Z(\omega) = \left[\frac{R_s\{1+(\omega C_{dl}R_p)^2\} + R_p}{1+(\omega C_{dl}R_p)^2}\right] + j\left[\frac{-\omega C_{dl}(R_p)^2}{1+(\omega C_{dl}R_p)^2}\right] \quad [\text{Equation 6}]$$

The parameter extractor 340 may calculate a parameter of the fuel cell 100 using a complex non-linear least square fitting method which is well known.

The parameter extractor 340 may convert a complex impedance Z into each frequency function as shown in the following Equation 7.

$$Z = f(\omega; \theta_i); \; \theta_i = R_s, R_p, C_{dl} \quad [\text{Equation 7}]$$

The parameters $R_s$, $R_p$, and $C_{dl}$ may be calculated by minimizing the following function "Φ".

$$\Phi = \sum_{i=1}^{n} [\text{Re}(y_i - Z_i)^2 + \text{Im}(y_i - Z_i)^2] \quad [\text{Equation 8}]$$

Here, $y_i$ represents actual measurement data, and Z(w) may be an impedance calculated by the equivalent model. The function "Φ" may be minimized by setting as the following Equation 9.

$$\partial \Phi / \partial \theta_i = 0; \; \theta_i = R_s, R_p, C_{dl} \quad [\text{Equation 9}]$$

At this time, when the calculated function has a change (Δθ), a new value may be obtained by a Taylor series expansion as shown in the following Equation 10.

$$Z(\omega)_{j+1} = \quad [\text{Equation 10}]$$
$$Z(\omega)_j + \frac{\partial Z(\omega)_j}{\partial R_s}\Delta R_s + \frac{\partial Z(\omega)_j}{\partial R_p}\Delta R_p + \frac{\partial Z(\omega)_j}{\partial C_{dl}}\Delta C_{dl}$$

Here, $\Delta R_s$, $\Delta R_p$, and $\Delta C_{dl}$ may be calculated by the Equations 8 and 10. As a result, $R_s$, $R_p$, and $C_{dl}$ may be updated by the $\Delta R_s$, $\Delta R_p$, and $\Delta C_{dl}$. The calculation may be continuously performed until the values are converged to a predetermined limit value (for example, 10-6) in order to obtain an optimum calculation value of the equivalent model parameter of a battery 2.

The parameter analyzer 350 may analyze by comparing the impedance parameter extracted by the method described above and a reference parameter. The parameter analyzer 350 may analyze by comparing the extracted impedance parameter and a corresponding reference value. The impedance parameter may be $R_s$, $R_p$, $C_{dl}$, etc.

The lifespan predictor 360 may predict the lifespan of the fuel cell 100 according to the comparison result of the impedance parameter compared and analyzed by the parameter analyzer 350 and the reference parameter. The lifespan predictor 360 may be detected by comparing the impedance parameter of the fuel cell 100 and the corresponding reference value (the impedance parameter of a reference fuel cell 100). When the impedance parameter of the fuel cell 100 has a difference with the corresponding reference value or does not have the difference, one the lifespan states may be allotted to the relevant fuel cell 100. For example, when the impedance of the fuel cell 100 is greater than the reference value in a range of a low frequency, an aging state of the fuel cell 100 may be worse than that of the fuel cell 100 having the impedance value which is equal to or less than the reference value. The aging state of the fuel cell 100 may be in relation with a magnitude of the difference between the calculated impedance parameter and the reference value. When the magnitude of the difference between the calculated impedance parameter and the reference value is increased, it may be determined that the lifespan of the fuel cell 100 is decreased. When the magnitude of the difference between the calculated impedance parameter and the reference value is decreased, it may be determined that the lifespan of the fuel cell 100 is good.

The warning unit 370 may output a warning signal to the outside when the lifespan of the fuel cell 100 predicted by the lifespan predictor 360 is equal to or less than the predetermined reference value. The warning signal may be output by a method of generating an audio signal, or a method of displaying its state on an external display unit.

Figure 4:
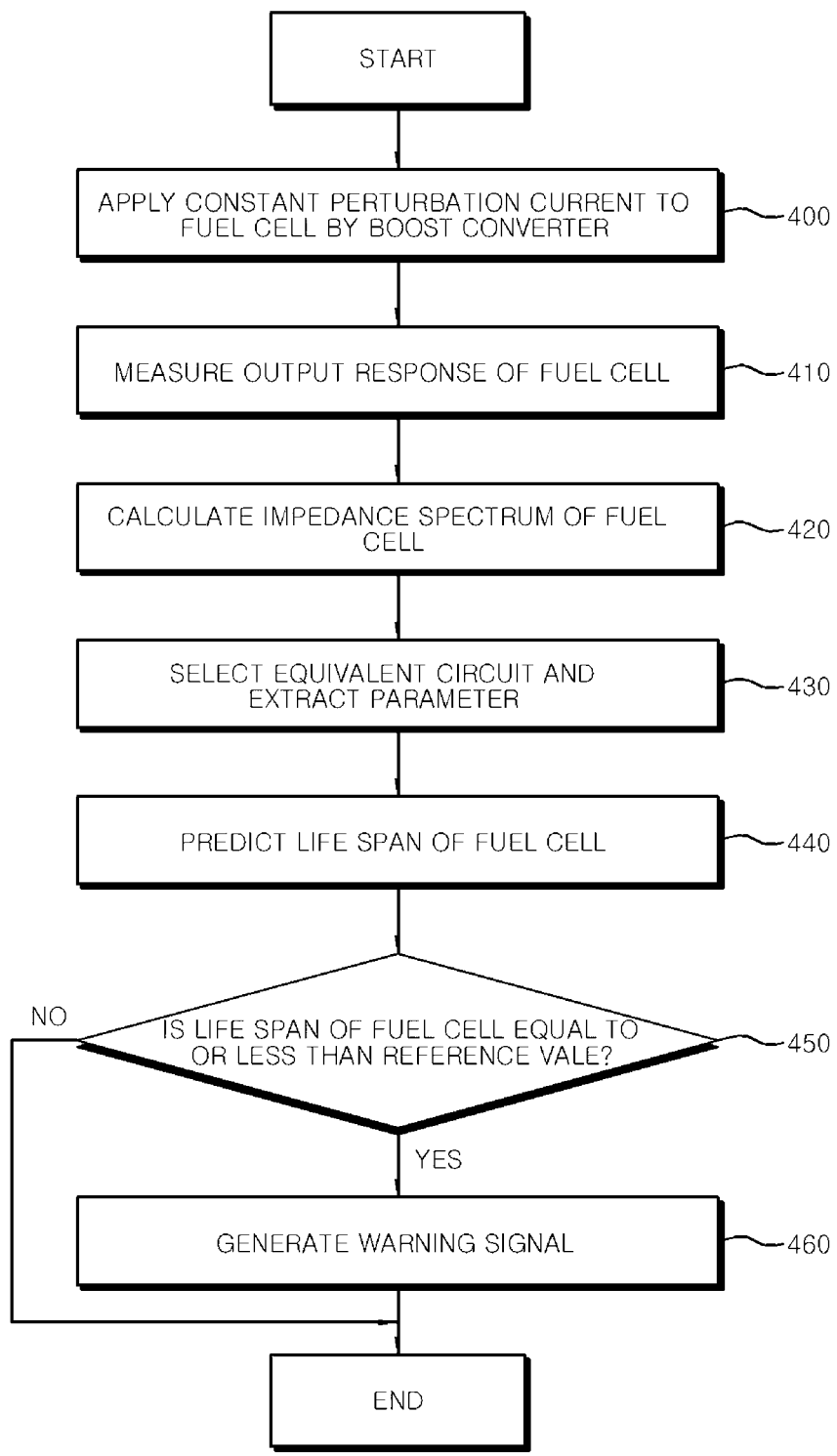
FIG. 4 is a control flowchart of a power converter for a fuel cell according to an exemplary embodiment of the present invention.

FIG. 4 is a control flowchart of a power converter for a fuel cell according to an exemplary embodiment of the present invention.

In the diagnosis mode, the power converter for the fuel cell may generate the perturbation current by the boost converter $L_1$, $Q_1$, and the perturbation current induced by the boost converter $L_1$, $Q_1$ may be applied to the fuel cell 100 (400).

The voltage detector 310 may detect the voltage of the fuel cell 100. The voltage detector 310 may detect the voltage for each frequency induced from the fuel cell 100 by the signal of the digital signal processor 100 (410).

The digital lock-in amplifier 320 may calculate the impedance spectrum of the voltage for each frequency detected by the voltage detector 310. (420).

The parameter extractor 340 may select the equivalent circuit model of the fuel cell 100 according to the impedance spectrum extracted by the digital lock-in amplifier 320. The equivalent circuit model may be modeled by the Randles equivalent circuit which is well known. The parameter extractor 340 may calculate the impedance of the equivalent circuit of the fuel cell 100 (430).

The parameter analyzer 350 may analyze by comparing the impedance parameter extracted by the method described above and the reference parameter. The parameter analyzer 350 may analyze by comparing the extracted impedance parameter and the corresponding reference value. The lifespan predictor 360 may predict the lifespan of the fuel cell 100 according to the comparison result of the impedance parameter compared and analyzed by the parameter analyzer 350 and the reference parameter (440).

The warning unit 370 may output the warning signal to the outside when the lifespan of the fuel cell 100 predicted by the lifespan predictor 360 is equal to or less than the predetermined reference value (450, 460).

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A power converter for a fuel cell, the power converter comprising:
   a boost converter connected to the fuel cell and configured to control a load voltage at a predetermined magnitude in a normal operation mode and to induce an output response by applying a predetermined perturbation current to the fuel cell in a diagnosis mode, wherein the normal operation mode is configured to supply a voltage in response to a change of a load and the diagnosis mode is configured to predict the lifespan of the fuel cell; and
   a digital signal processor configured to extract an impedance parameter by detecting the output response of the fuel cell in the diagnosis mode, and predict a lifespan of the fuel cell according to the impedance parameter,
   wherein the power converter further comprises an auxiliary energy storage device connected between the boost converter and the load, configured to be charged by power from the fuel cell and to discharge power from the auxiliary energy storage device to the load in addition to the power from the fuel cell.

2. The power converter of claim 1, wherein the power converter further comprises a bidirectional converter connected to the auxiliary energy storage device, and configured to be switched so as to handle an abrupt change or a transient overload of the load.

3. The power converter of claim 2, wherein the bidirectional converter is configured to control an output voltage of the load in order to generate a perturbation current signal for a diagnosis by the boost converter in the diagnosis mode.

4. The power converter of claim 3, wherein the boost converter is configured to induce the perturbation current having a constant direct current (DC) level in the diagnosis mode, and the bidirectional converter is configured to be switched and to control the load voltage by charging or discharging the auxiliary energy storage device.

5. A power converter for a fuel cell, the power converter comprising:
   a boost converter connected to the fuel cell and configured to control a load voltage at a predetermined magnitude in a normal operation mode and to induce an output response by applying a predetermined perturbation current to the fuel cell in a diagnosis mode, wherein the normal operation mode is configured to supply a voltage in response to a change of a load and the diagnosis mode is configured to predict the lifespan of the fuel cell; and
   a digital signal processor configured to extract an impedance parameter by detecting the output response of the fuel cell in the diagnosis mode, and predict a lifespan of the fuel cell according to the impedance parameter,
   wherein the digital signal processor further comprises:
      a voltage detector configured to measure the output response of the fuel cell;
      a digital lock-in amplifier configured to calculate an impedance spectrum of a voltage detected by the voltage detector;
      a parameter extractor configured to calculate a parameter according to the impedance spectrum extracted by the digital lock-in amplifier;
      a parameter analyzer configured to analyze and compare the parameter with a reference parameter wherein the parameter is obtained by the parameter extractor and; and
      a lifespan predictor configured to predict the lifespan of the fuel cell according to a comparison result between the impedance parameter compared and analyzed by the parameter analyzer and the reference parameter which is previously stored.

6. A method for controlling a power converter for a fuel cell, the method comprising:
   operating according to at least one of a normal operation mode and a diagnosis mode, wherein the normal operation mode is configured to supply a voltage in response to a change of a load and wherein a diagnosis mode is configured to predict a lifespan of the fuel cell; and in the diagnosis mode, switching a boost converter for applying a perturbation current having a constant magnitude to the fuel cell and switching a bidirectional converter to maintain a voltage output from the fuel cell at a constant DC level by charging or discharging an auxiliary energy storage device so as to control a voltage of the load, wherein the converter comprises the load, the fuel cell configured to supply power to the load, the boost converter connected to the fuel cell and configured to be switched, the auxiliary energy storage device connected between the boost converter and the load and configured to charge or discharge, the bidirectional converter configured to switch so that the auxiliary energy storage device is charged or discharged, and the digital signal processor configured to perform a signal processing by detecting an output of the fuel cell.

7. The method of claim 6, wherein, in the normal operation mode, the boost converter controls the voltage output from the fuel cell at a predetermined magnitude, and the bidirectional converter charges or discharges the auxiliary energy storage device in order to implement a load leveling operation.

8. The method of claim 6, wherein, in the diagnosis mode, the digital signal processor measures an output response of the fuel cell, calculates an impedance spectrum from the output response, calculates a parameter according to the impedance spectrum, and predicts the lifespan by comparing the parameter with a pre-stored reference parameter.

9. The method of claim 8, wherein the digital signal processor generates a warning signal if the lifespan of the fuel cell is equal to or less than a reference value.

* * * * *